United States Patent [19]
Farb

[11] Patent Number: 5,527,721
[45] Date of Patent: Jun. 18, 1996

[54] METHOD OF MAKING FET WITH TWO REVERSE BIASED JUNCTIONS IN DRAIN REGION

[75] Inventor: Joseph E. Farb, Riverside, Calif.

[73] Assignee: Hughes Aircraft Company, Los Angeles, Calif.

[21] Appl. No.: 517,801

[22] Filed: Aug. 22, 1995

Related U.S. Application Data

[60] Continuation of Ser. No. 270,547, Jul. 5, 1994, abandoned, which is a division of Ser. No. 923,675, Aug. 3, 1992, Pat. No. 5,352,914.

[51] Int. Cl.⁶ .................................................. H01L 21/8234
[52] U.S. Cl. .................................. 437/29; 437/41; 437/44
[58] Field of Search .......................... 437/29, 44, 41 CS; 257/402

[56] References Cited

U.S. PATENT DOCUMENTS

| | | |
|---|---|---|
| 3,855,610 | 12/1974 | Masuda et al. . |
| 4,714,519 | 12/1987 | Pfiester . |
| 4,746,624 | 5/1988 | Cham et al. ............................... 437/44 |
| 4,931,408 | 6/1990 | Hshieh ....................................... 437/44 |
| 4,943,537 | 7/1990 | Harrington III ........................... 437/34 |
| 5,124,770 | 6/1992 | Umemoto et al. . |

FOREIGN PATENT DOCUMENTS

| | | |
|---|---|---|
| 0181091 | 5/1986 | European Pat. Off. . |
| 0249204 | 12/1987 | European Pat. Off. . |
| 0387722 | 9/1990 | European Pat. Off. . |
| 56-090556 | 7/1981 | Japan . |
| 57-114281 | 7/1982 | Japan . |
| 61-214477 | 9/1986 | Japan . |
| 61-226965 | 10/1986 | Japan . |
| 1-175258 | 7/1989 | Japan . |

*Primary Examiner*—George Fourson
*Assistant Examiner*—Richard A. Booth
*Attorney, Agent, or Firm*—M. E. Lachman; M. W. Sales; W. K. Denson-Low

[57] ABSTRACT

A polysilicon gate (42) of an N-channel MOSFET (40) includes a P+ doped central portion (42a), and N+ doped lateral portions (42b, 42c) which face an N-type source (24c) and drain (26c) respectively. An N-type dopant is implanted into the surface portion of a P-type channel region (18) to reduce the surface doping and adjust the transistor threshold voltage to approximately 0.8 volts. The lowered channel doping reduces the electric field at the drain (26c) and suppresses injection of hot electrons from the drain (26c) into the gate oxide (14), and also reduces the electric field across the gate oxide (14) and suppresses charging thereof by hot electrons. N-type and P-type graded strata (26a, 26b) are formed between the drain (26c) and substrate (12) and create two reverse biased diode junctions which block flow of drain current from the channel region (18), thereby eliminating the creation of hot electrons and impact ionization in the bulk portion of the drain diode, and channel charge carriers through the surface portion of the channel region (18). The surface portions of the channel region (18), drain (26c) and graded strata (26a, 26b) are shorted together to form a shorting surface channel through which the charge carriers are constrained to flow.

2 Claims, 3 Drawing Sheets

5,527,721

1

METHOD OF MAKING FET WITH TWO REVERSE BIASED JUNCTIONS IN DRAIN REGION

This is a continuation of application Ser. No. 08/270,547, filed Jul. 5, 1995 now abandoned which is a division of Ser. No. 07/923,675 filed Aug. 3, 1992 now U.S. Pat. No. 5,352,914.

BACKGROUND OF THE INVENTION

1. Field of the Invention

The present invention generally relates to metal-oxide-semiconductor field-effect transistors (MOSFETs), and more specifically to a method of fabricating an N-channel MOSFET with a structure for suppressing hot-electron injection and related effects.

2. Description of the Related Art

Advances in integrated circuit technology have made possible the fabrication of MOSFETs with channel lengths of less than one-half micrometer. In order to prevent punch-through, in which the depletion regions of the source and drain merge together to form an uncontrollable continuous channel, the doping of the substrate in the channel region is made considerably higher than in MOSFETs with longer channels. However, this produces a steep doping concentration gradient across the source/substrate and drain/substrate metallurgical junctions, which increases the electric field across the junctions.

In N-channel devices, the high electric field causes impact ionization to occur in the drain depletion region where hole-electron pairs are created by the impact of the drain current in the high field region (they hit the silicon atoms). Some of the electrons generated by impact ionization are called "hot electrons". The generated holes create the problem of "snapback" (parasitic n-p-n bipolar action) whereas the generated "hot electrons" create the problem of gate oxide charging.

Snapback occurs when the lateral parasitic n-p-n bipolar transistor (source-substrate-drain) is turned on by the large impact ionization current from the drain before the substrate-drain diode breaks down. The minimum drain voltage at which snapback occurs, known as the "snapback voltage", decreases detrimentally as the channel doping is increased and the drain/substrate electric field is correspondingly increased.

High channel doping also causes the electric field across the gate oxide to be high enough that electrons generated by impact ionization will be injected into the gate oxide and create a negative charge layer therein. Gate oxide charging, which continues to increase with time during device operation, is detrimental to the long term operation of the MOSFET. An analysis of hot electron and related short channel effects is presented in a textbook entitled "Physics of Semiconductor Devices", 2nd Edition, by S. Sze, John Wiley & Sons, 1981, pp. 480–486.

A method of reducing the electric field across the drain/substrate junction, and thereby reducing hot electron injection and related effects, is disclosed in U.S. Pat. No. 5,0∪∪, 477, entitled "METHOD OF MAKING A LATCH UP FREE, HIGH VOLTAGE, CMOS BULK PROCESS FOR SUB-HALF MICRON DEVICES", issued Apr. 9, 1991 to Joseph E. Farb (the present inventor). This patent discloses an N-channel MOSFET including graded source and drain regions which are lightly doped by ion implantation and then subjected to thermal cycling to diffuse the implanted impurities. The surface portions of the source and drain regions for connection to ohmic contacts are then subjected to a heavy doping implant. The reduced dopant concentration gradient provided by the lightly and heavily doped drain regions in series reduces the electric field across the drain/substrate metallurgical junction and thereby the injection of hot electrons and related effects.

SUMMARY OF THE INVENTION

A polysilicon gate of an N-channel MOSFET fabricated by a method embodying the present invention includes a P+ doped central portion, and N+ doped lateral portions which face an N-type source and drain respectively.

An N-type dopant is implanted into the surface portion of a P-type channel region to reduce the surface doping and adjust the transistor threshold voltage to approximately 0.8 volts. The lowered channel doping reduces the electric field at the drain and suppresses injection of hot electrons from the drain into the channel region, and also reduces the electric field across the gate oxide and suppresses charging thereof by hot electrons.

N-type and P-type graded strata are formed between the drain and substrate and create two reverse biased diode junctions which block flow of drain current across the high electrical field in the bulk drain diode, and channel charge carriers through the surface portion of the channel region where the electrical field has been reduced. The surface portions of the channel region, drain and graded strata are shorted together to form a secondary surface channel through which the charge carriers are urged to flow.

The present structure reduces hot carrier injection, impact ionization and related effects by preventing electrons from flowing to the bulk drain diode region from the substrate under the channel region, and providing a low resistance, low field path for electron flow at the surface of the channel region. Since substantially all electron flow current flows from the source through the surface portion of the channel region to the drain, hot electron injection is essentially eliminated. A MOSFET embodying the present invention also has no snapback before the diode goes into avalanche breakdown.

In addition, since the depleted channel regions extending from the source and drain are caused by the N+ lateral portions of the gate and current through the channel is affected only by the P+ central portion of the gate, hot electron injection is further suppressed.

Although the present invention is primarily directed to N-channel devices, it is equally applicable to P-channel devices in which a problem with hot carrier injection is present.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
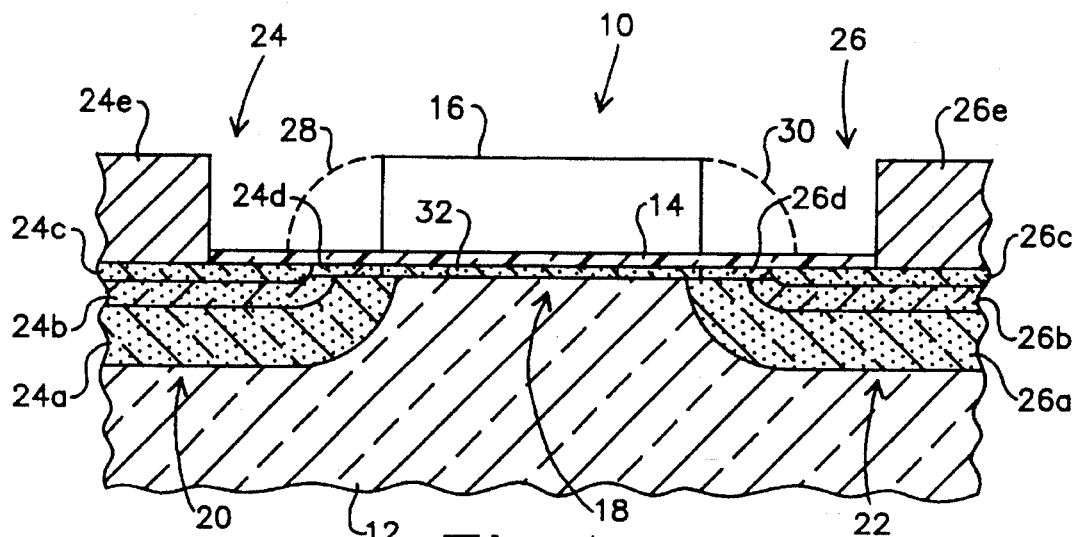
FIG. 1 is a simplified sectional view illustrating a first embodiment of a MOSFET embodying the present invention.

Referring to FIG. 1, a MOSFET embodying the present invention is generally designated as 10, and includes a semiconductor substrate 12. The MOSFET 10 is an N-channel enhancement device, and the substrate 12 is typically silicon which is lightly doped to have P-type conductivity. The configuration illustrated in FIG. 1 is especially suitable for a short-channel MOSFET having a channel length which can be as small as the sub-half micrometer range. It will be understood that although only the N-channel MOSFET 10 is illustrated, it may be formed together with P-channel MOSFETs on the substrate 12 in a complementary metal-oxide-semiconductor (CMOS) integrated circuit configuration.

A silicon dioxide layer 14 is formed on the surface of the substrate 12 to a thickness which can vary between approximately 100–1,000 angstroms. The portion of the layer 14 which is visible in FIG. 1 constitutes a gate oxide portion, whereas portions of the layer 14 external of the MOSFET 10 constitute field oxide portions which isolate the N-channel and P-channel MOSFETs from each other. A polysilicon gate 16 is formed over the gate oxide portion of the layer 14. A channel region 18 is defined in the substrate 12 under the gate 16.

The MOSFET 10 further includes a source region 20 and a drain region 22 on opposite sides of the channel region 18. A source structure 24 and a drain structure 26 are formed in the regions 20 and 22 respectively. The source structure 24 includes a first doped strata 24a which incorporates therein a dopant with N-type conductivity, typically phosphorous or arsenic, to a concentration of approximately $10^{18}$–$10^{19}$ ions/cm$^3$. The strata 24a is preferably graded such that the dopant concentration decreases from the surface of the strata 24a toward the substrate 12. The thickness of the strata 24a is preferably on the order of 0.3 micrometers.

A second doped strata 24b is formed in the upper portion of the first strata 24a, and incorporates therein a P-type dopant, typically boron, to a concentration which is approximately one-third that of the first doped strata 24a, and is preferably graded such that the dopant concentration decreases from the surface of the strata 24b toward the strata 24a. The thickness of the strata 24b is preferably on the order of 0.2 micrometers.

A source 24c is formed in the upper portion of the second doped strata 24b, and is heavily doped N+type with phosphorous or arsenic. The dopant concentration of the source 24c is approximately $10^{19}$–$10^{21}$ ions/cm$^3$, and the thickness of the source 24c can vary between approximately 0.05–0.2 micrometers.

In accordance with the present invention, a shorting doped strata 24d is formed in the surface portion of the substrate 12, extending from the source 24c through the upper end portions of the strata 24a and 24b to the surface portion of the channel region 18. The strata 24d incorporates therein an N-type dopant to a concentration of approximately $10^{16}$–$10^{21}$ ions/cm$^3$.

The thickness of the strata 24d can vary between approximately 0.1–0.3 micrometers. As will be described in detail below, the strata 24d constitutes a shorting N-type channel across the top of the P-type regions 24b and 26b under the spacers 28 and 30. Further illustrated is a source ohmic metal pad 24e which extends through a window formed through the oxide layer 14 into ohmic contact with the source 24c.

The drain structure 26 includes a first doped strata 26a, second doped strata 26b, drain 26c, shorting doped strata 26d and drain pad 26e which are essentially similar to the corresponding elements of the source structure 24.

In general applications, the source and drain of a MOSFET are identical, and are interchangeable depending on the desired application. However, since hot electron injection occurs only at the drain of a MOSFET, in an application in which the source and drain are preselected and will not be interchanged, the dopant strata 24a and 24b can be omitted and the source structure 24 simplified to include only the source 24c, doped strata 24d and pad 26e.

Further illustrated in broken line are silicon dioxide sidewall spacers 28 and 30 which are formed on the sidewalls of the gate 16 which face the source structure 24 and drain structure 26 respectively. The spacers 28 and 30 are formed temporarily during the fabrication of the MOSFET 10, and are removed after their function has been completed as will be described in detail below.

The second doped strata 26b (or the strata 24b if the source and drain are reversed in a particular circuit application) creates a barrier which suppresses impact ionization and thereby the creation of hot electrons from the drain region 22, and this eliminates the resulting undesirable snapback and greatly reduces oxide charging effects by as much as several orders of magnitude.

More specifically, the P-type strata 26b forms two reverse biased diode junctions with the adjoining N-type strata 26a and drain 26c respectively, which block flow of charge carriers in the form of both electrons and holes therethrough between the drain region 22 and substrate 12. The doping concentration of the strata 26b can vary over the relatively wide range stipulated above and still produce the desired effect. However, the doping concentration of the strata 26b is preferably made as low as possible while still converting the strata 26b to P-type and creating the reverse biased diode junctions, as this will maximize the breakdown voltage of the MOSFET 10.

The shorting doped strata 26d is necessary to provide a low field path for flow of charge carriers (electrons) between the drain 26c the surface portion of the channel region 18, since current flow is blocked by the second doped strata 26b. Since the strata 26d (and 24d) is not covered by the gate 16, the strata 26d is not controlled by the gate voltage and is constantly electrically conductive.

The strata 26d constitutes a shorting channel which is constantly conducting, and shorts out the depletion region extending from the drain 26c toward the gate 16 and creates a further barrier to hot electron injection. In this manner, the channel current is controlled only in the central portion of the channel under the gate 16 and the reduction or reversal of the electric field across the gate oxide.

The doping concentration of the strata 26d can vary over the range stipulated above and still produce the desired effect. A relatively high doping concentration will provide increased current handling capability and power, whereas a relatively low doping concentration will provide a higher device operating voltage.

The doping strata 26b and 26d constitute a carrier channeling means for urging charge carriers to flow only through the surface portion of the channel region 18. The strata 26b blocks flow of charge carriers from the drain region 22 into the drain 26c, whereas the strata 26d provides a low resistance path at the surface portion of the channel region 18 through which the charge carriers are being constrained to flow.

Although the gate 16 can be doped N+ within the scope of the invention as is conventional for N-channel MOSFETs, the gate 16 is preferably doped P+ to further enhance the charge carrier channeling effect and suppress hot carrier injection and impact ionization. However, P+ polysilicon has a work function which is one bandgap (1.1 volts) higher than that of N+ polysilicon. If the conventional N+ polysilicon were replaced with P+ polysilicon without further modification, the threshold voltage of the MOSFET 10 would be increased to an undesirably high level.

In order to compensate for this effect, a threshold adjustment doped strata 32 is formed in the surface portion of the channel region 18 under the gate 16, and interconnects the shorting doped strata 24d and 26d. The strata 32 is doped with an N-type dopant, typically phosphorous or arsenic, to lower the doping concentration at the surface of the channel region 18.

The doping concentration in the strata 32 will range from approximately $10^6$–$10^8$ ions/cm$^3$ with the actual value being selected in accordance with the geometry of the MOSFET 10 to adjust the threshold voltage to approximately 0.8 volts. The manner in which the threshold voltage varies as a function of the doping concentration in the strata 32 is known per se, such as described in a textbook entitled "VLSI Technology" 2nd Edition, by S. Sze, Mc-Graw Hill, 1988, pp. 490–493.

The strata 32 further urges charge carriers to flow only through the center portion of the channel region 18 and thereby suppresses flow of hot electrons from the drain region 22 into the gate oxide 14 by vastly reducing the field across the gate oxide (and in some cases actually reversing the field across the gate oxide). Since the metallurgical doping in the strata 32 is N-type, this reduces the doping concentration gradient across the metallurgical junction between the drain 26c and the surface portion of the channel region 18, and thereby the electric field across the junction. The reduced electric field suppresses impact ionization and hot electron creation from the drain region 22.

The inverted surface dopant concentration in the channel region 18 also reduces the electric field across the gate oxide layer 14 under the gate 16. This reduced electric field suppresses charging of the gate oxide layer 14 by electrons generated by impact ionization in the drain region 22.

Figure 2:
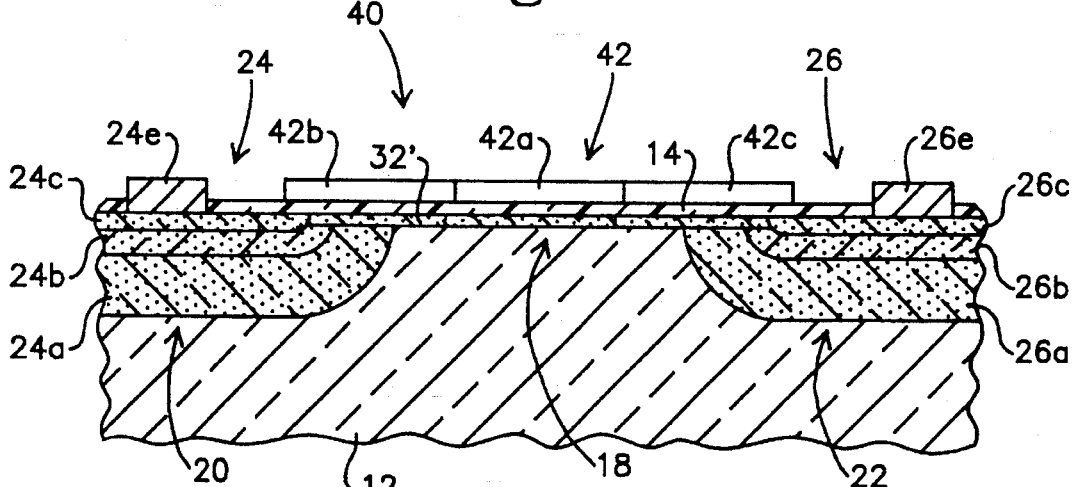
FIG. 2 is similar to FIG. 1, but illustrates a second embodiment of the invention.

Whereas the configuration illustrated in FIG. 1 is especially suitable for a short-channel MOSFET, the configuration illustrated in FIG. 2 is especially suitable for a long-channel, high power MOSFET. As viewed in FIG. 2, a MOSFET 40 includes elements which are common to those of the MOSFET 10, and are designated by the same reference numerals.

The MOSFET 40 differs from the MOSFET 10 in that a polysilicon gate 42 includes a central portion 42a which is doped P+, and lateral portions 42b and 42c which face the source structure 24 and drain structure 26 respectively and are doped N+. The threshold adjustment doped strata, here designated as 32', extends under substantially the entire gate 42 and is equivalent to the strata 32, 24d and 26d in combination.

The threshold voltage of the channel region under the P+ portion 42a of the gate 42 is 0.8 volts as with the MOSFET 10, and the MOSFET 40 operates in enhancement mode in this region. However, the threshold voltage of the channel region 18 under the N+ portions 42b and 42c of the gate 42 is at least 1.1 volts lower than under the P+ portion 42a, or at most −0.3 volts. Thus, the MOSFET 40 operates in depletion mode in the regions of the channel under the portions 42b and 42c of the gate 42, and the channel is constantly conductive in these regions.

The MOSFET 40 functions as a buried channel device in under the lateral portions 42b and 42c of the gate 42, with the operation being similar to that provided by the shorting strata 24d and 26d of the MOSFET 10. It will be noted that in an arrangement in which the functions of the source and drain are preselected and will not be interchanged, the lateral portion 42b of the gate 42 can be P+ and constitute an extension of the central portion 42a, and the dopant strata 24a and 24b can be omitted and the source structure 24 simplified to include only the source 24c and pad 26e as described above.

Figure 3A:
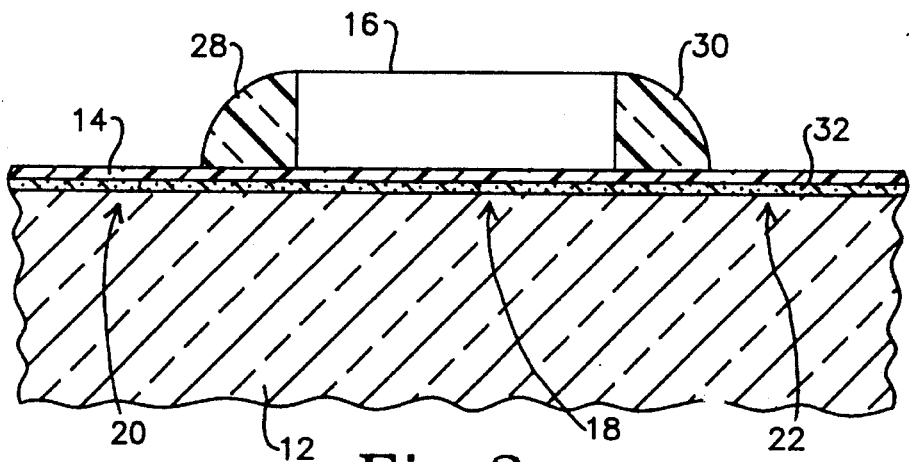
FIGS. 3a to 3g are simplified sectional views illustrating a method of fabricating the MOSFET of FIG. 1 in accordance with the invention.

A process or method of fabricating the MOSFET 10 in accordance with the present invention using the sidewall spacers 28 and 30 will be described with reference to FIGS. 3a to 3g. In FIG. 3a, the threshold adjustment doped layer 32 is formed in the surface portion of the substrate 12 by ion implantation. The oxide layer 14 is deposited onto the surface of the substrate 12, and the polysilicon gate 16 is deposited onto the layer 14 using photolithographic masking technology.

The sidewall spacers 28 and 30 are formed by depositing a layer of silicon dioxide approximately 3,000 angstroms thick over the gate 16 and oxide layer 14 followed by anisotropic dry etching. Since the thickness of the silicon dioxide is greater at the sidewalls of the gate 16 than on the horizontal surfaces of the gate 16 and oxide layer 14, performing the etching step sufficiently to remove the silicon dioxide from the horizontal surfaces will leave the sidewall spacers 28 and 30 in place as illustrated.

Figure 3B:
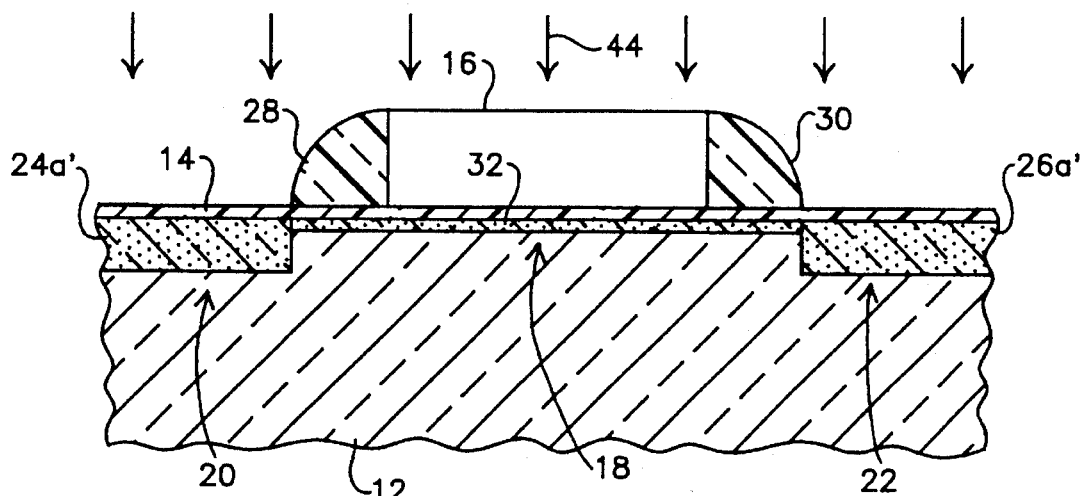

The first doped strata 24a and 26a are formed by ion implantation of phosphorous or arsenic as indicated by arrows 44 in FIG. 3b. The implantation energy is selected such that the dopant ions are unable to pass through the relatively thick gate 16 and sidewall spacers 28 and 30, but pass through the relatively thin oxide layer 14 on the opposite sides of the gate 16 and spacers 28 and 30. The implantation energy range in which this can be performed is typically 100±50 KeV. The strata formed by this step are designated as 24a' and 26a'.

Figure 3C:
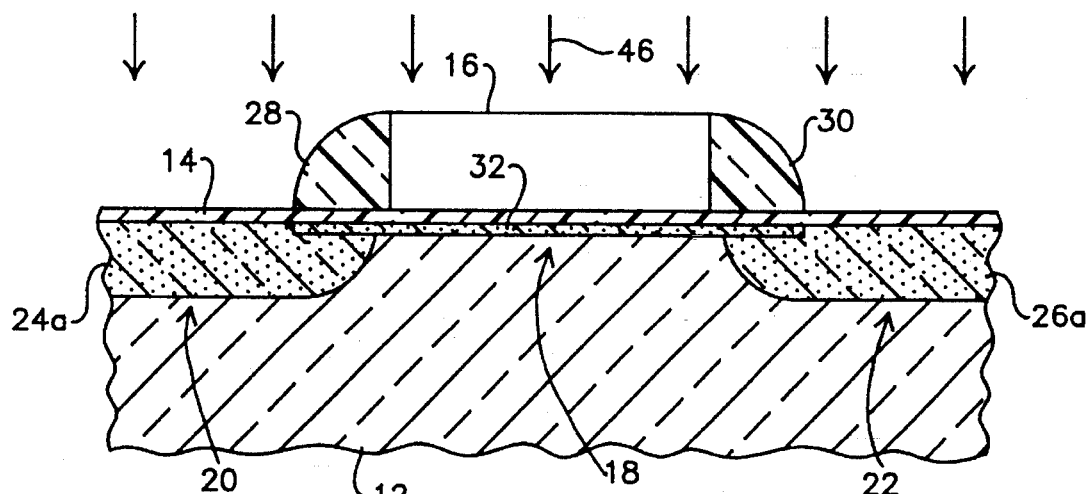

In the next step of the method as illustrated in FIG. 3c, the substrate 12 is heated as indicated by arrows 46 to cause the dopant in the strata 24a' and 26a' to thermally diffuse vertically and laterally into the substrate 12. Typically, after appropriate ramp-up and stabilization, the substrate 12 will be subjected to a temperature of approximately 1,050° C. for 15 minutes in the presence of oxygen, and for an additional 25 minutes in the presence of argon. The strata, now designated as 24a and 26a, have approximately their final shape, with the doping concentration decreasing from the surface of the strata 24a and 26a downwardly toward the bulk of the substrate 12.

Figure 3D:
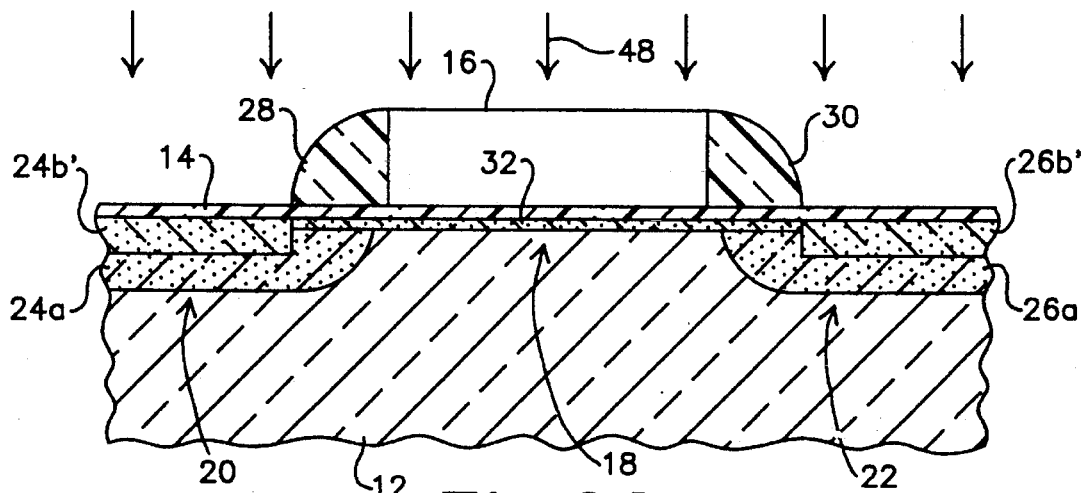

As illustrated in FIG. 3d, the strata 24b and 26b are formed by ion implantation of boron as indicated by arrows 48 into the surface portions of the strata 26a and 26a to approximately two-thirds the dopant concentration of the strata 24a and 26a. This can be accomplished with an implantation energy of typically 50±25 KeV. The strata formed in accordance with the step of FIG. 3d are designated as 24b' and 26b'.

Figure 3E:
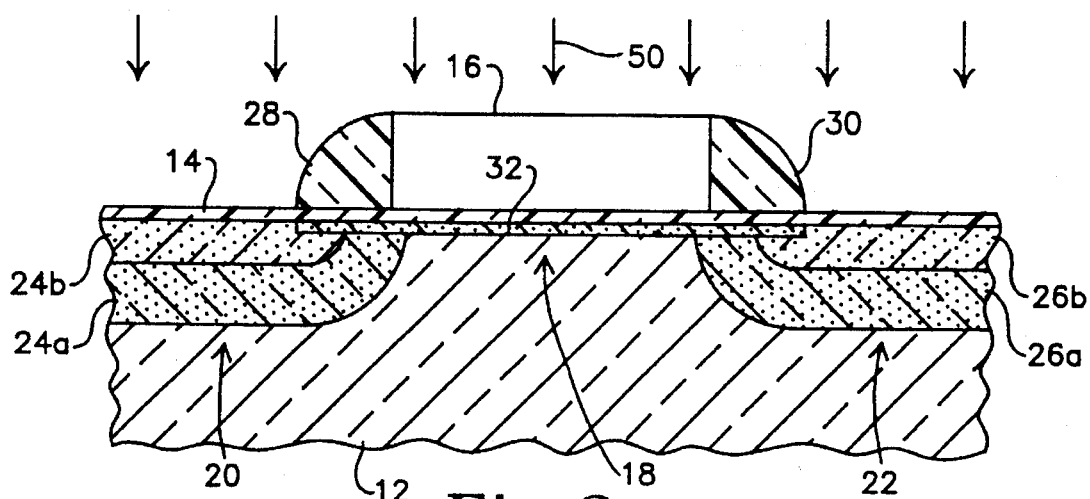

In the next step of the present method as illustrated in FIG. 3e, the substrate 12 is heated as indicated by arrows 50 in a manner similar to that described with reference to FIG. 3c, except that the heating is performed for approximately one-half the time as for the strata 24a and 26a. The strata formed in accordance with the step of FIG. 3e have approximately their final shape, and are designated as 24b and 26b. The dopant in the strata 24b' and 26b' diffuses vertically and laterally such that the dopant concentration decreases from the surface of the strata 24b and 26b downwardly toward the bulk of the substrate 12.

Figure 3F:
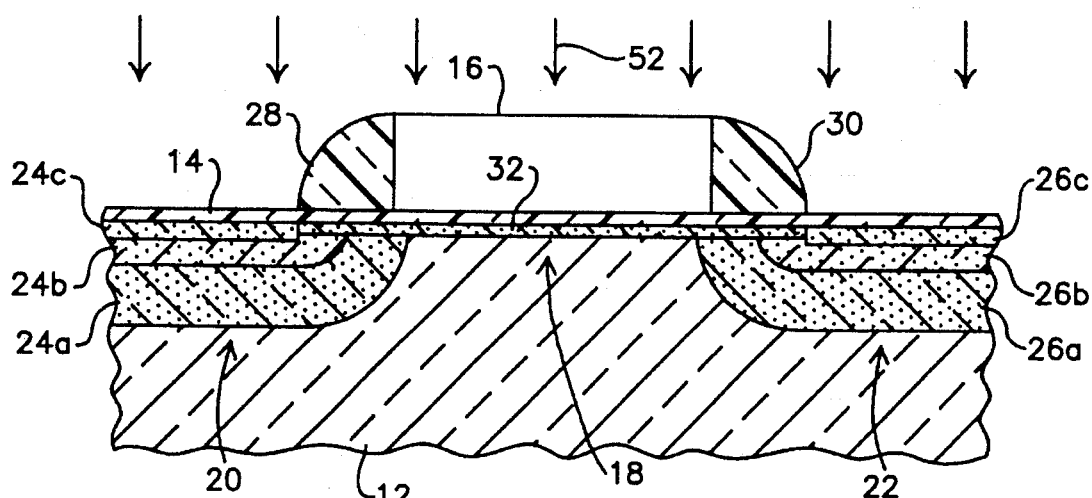
Figure 3G:
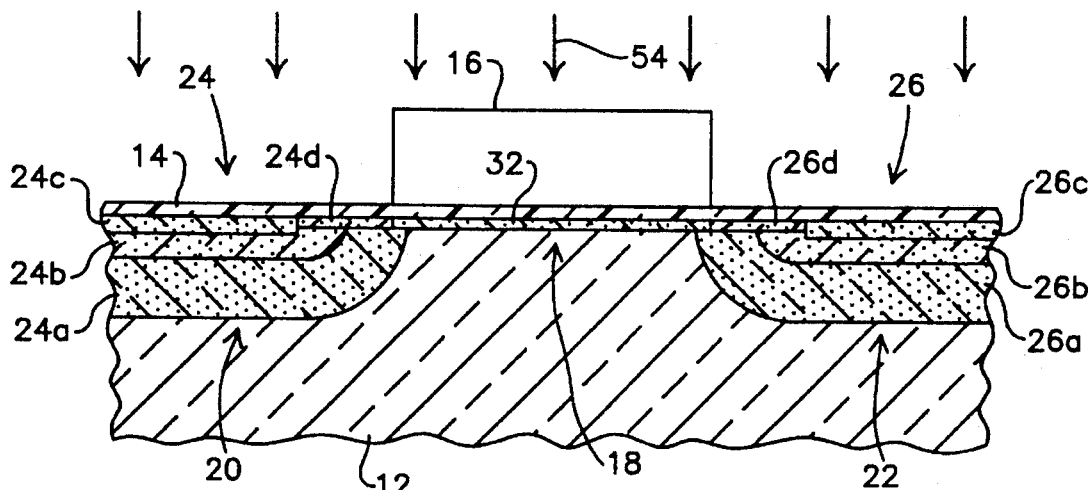

As illustrated in FIG. 3f, the source 24c and drain 26c are formed by implantation of phosphorous or arsenic into the surface portions of the strata 24b and 26b as indicated by arrows 52. In FIG. 3g, the sidewall spacers 28 and 30 are removed, and the shorting strata 24d and 26d are formed by implantation of phosphorous or arsenic as indicated by arrows 54.

The spacers 28 and 30 are typically removed by masking the areas of the surface of the substrate 12 and gate 16 except over the spacers 28 and 30, and dissolving away the spacers 28 and 30 using wet oxide etching. Although the step of FIG. 3g also causes implantation of ions into the exposed areas of the source 24c and drain 26c, these areas are already heavily doped and the additional implant does not have any detrimental effect.

Subsequent to the step of FIG. 3g, the source and drain pads 24e and 26e are formed, and other conventional steps are performed including vapor deposition of oxide and rapid thermal annealing to flow the oxide and activate the source and drain structures 24 and 26 to create the finished MOSFET 10 as illustrated in FIG. 1.

The sidewall spacers 28 and 30 provide self-alignment for the formation of the doped strata 24a, 26a, 24b, 26b, 24d, 26d, source 24c, and drain 26c in the MOSFET 10. However, the spacers 28 and 30 can only extend toward the source and drain structures 24 and 26 respectively by a distance which is approximately equal to the height of the gate 16. This limits the method of FIGS. 3a to 3g to MOSFETs with relatively short channels. More specifically, the shorting doped strata 24d and 26d which constitute the secondary channels as described above and are formed by self-alignment using the spacers 28 and 30 can only be as long as the height of the gate 16.

A long-channel, high-power MOSFET 40 as illustrated in FIG. 2 requires longer secondary channels. These are provided in the form of the lateral portions 42b and 42c of the gate 42 which create buried channels underneath which are constantly conductive and cannot be turned off by the gate 42. The method of fabricating the MOSFET 40 is similar to that for the MOSFET 10 except that the sidewall spacers 28 and 30 are omitted. The gate 42 is initially formed in its entirety by deposition of N+polysilicon. The central portion 42a is then converted to P+ by photolithographic masking and ion implantation of boron.

While several illustrative embodiments of the invention have been shown and described, numerous variations and alternate embodiments will occur to those skilled in the art, without departing from the spirit and scope of the invention.

For example, although the present invention is primarily directed to N-channel devices, it is equally applicable to P-channel devices in which a problem with hot carrier injection is present. In the case of P-channel devices, the polarities and dopant types will be reversed from those described above for N-channel devices.

Accordingly, it is intended that the present invention not be limited solely to the specifically described illustrative embodiments. Various modifications are contemplated and can be made without departing from the spirit and scope of the invention as defined by the appended claims.

I claim:

1. A method of fabricating a field-effect transistor, comprising the steps of:

(a) providing a semiconductor substrate of a first conductivity type having a channel region, and a source region and a drain region on opposite sides of the channel region respectively;

(b) forming a source of the second conductivity type in the source region;

(c) forming a gate oxide layer over the channel region;

(d) forming a conductive gate over the gate oxide layer;

(e) forming a first doped strata of the second conductivity type in the drain region;

(f) forming a second doped strata of the first conductivity type in a surface portion of the first doped strata;

(g) forming a drain of the second conductivity type in a surface portion of the second doped strata; and (h) forming by ion implanation a shorting doped strata of the second conductivity type which extends substantially from said channel region through said surface portions of the first and second doped strata to the drain.

2. A method as in claim 1, in which:

step (e) further comprises heating the drain region to cause vertical and lateral diffusion of said dopant ions of the second conductivity type therein; and step (f) further comprises heating the drain region to cause vertical and lateral diffusion of said dopant ions of the first conductivity type therein, wherein said steps of heating form a gradient of said dopant ions that decreases downwardly from the surface portions of said first doped strata and said second doped strata.

* * * * *